United States Patent
Loopstra et al.

(10) Patent No.: US 7,593,096 B2
(45) Date of Patent: Sep. 22, 2009

(54) LITHOGRAPHIC APPARATUS AND DEVICE MANUFACTURING METHOD

(75) Inventors: Erik Roelof Loopstra, Heeze (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 291 days.

(21) Appl. No.: 11/433,767

(22) Filed: May 15, 2006

(65) Prior Publication Data

US 2007/0263201 A1    Nov. 15, 2007

(51) Int. Cl.
*G03B 27/58* (2006.01)

(52) U.S. Cl. .............................. 355/72; 355/53; 355/75; 165/80.4

(58) Field of Classification Search ............... 355/53, 355/72, 75; 165/80.4
See application file for complete search history.

(56) References Cited

U.S. PATENT DOCUMENTS

| | | | | |
|---|---|---|---|---|
| 4,184,188 A | | 1/1980 | Briglia | 361/234 |
| 4,509,852 A | * | 4/1985 | Tabarelli et al. | 355/30 |
| 5,088,006 A | * | 2/1992 | del Puerto et al. | 361/699 |
| 5,203,401 A | * | 4/1993 | Hamburgen et al. | 165/80.4 |
| 5,350,479 A | | 9/1994 | Collins et al. | 156/345 |
| 5,474,614 A | * | 12/1995 | Robbins | 118/728 |
| 5,583,737 A | * | 12/1996 | Collins et al. | 361/234 |
| 2004/0240513 A1 | * | 12/2004 | del Puerto | 374/44 |
| 2006/0017893 A1 | | 1/2006 | Mertens et al. | 355/30 |

FOREIGN PATENT DOCUMENTS

| | | |
|---|---|---|
| EP | 1 241 706 A2 | 9/2002 |
| EP | 1 530 088 A1 | 5/2005 |
| EP | 1 653 283 A2 | 5/2006 |

OTHER PUBLICATIONS

European Search Report issued for European Patent Application No. 07107271.4-1226, dated Jul. 16, 2007.

* cited by examiner

*Primary Examiner*—Diane I Lee
*Assistant Examiner*—Steven H Whitesell-Gordon
(74) *Attorney, Agent, or Firm*—Pillsbury Winthrop Shaw Pittman LLP

(57) ABSTRACT

An article support constructed to support an article for lithographic processing purposes is described. The article support includes a channel configuration arranged to guide thermally stabilizing media in the article support to provide thermal stabilization to the article, wherein the channel configuration comprises an input channel structure and an output channel structure, the input and output channel structures arranged in a nested configuration and connected to each other by a fine grid structure provided at or near a surface of the article support. A lithographic apparatus and device manufacturing incorporating the article support is also described.

19 Claims, 6 Drawing Sheets

LITHOGRAPHIC APPARATUS AND DEVICE MANUFACTURING METHOD

FIELD

The present invention relates to an article support constructed to support an article for lithographic processing purposes, in particular, for immersion lithographic processing purposes.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In recent developments, an increased problem of providing thermally stable articles, such as a substrate to be targeted with a patterned beam or a reticle, occurs due to ever more demanding requirements for image resolution, in particular in the new field of immersion lithography. Here, thermal stabilization is difficult, since an immersion liquid may cause thermal cooling by transitioning to a vapor phase. Hence, a considerable local thermal gradient may occur in the article that needs to be stabilized. Also or alternatively, during a photolithographic treatment of an article, the article, due to subsequent illuminations of target portions, tends to be warmed up unevenly. This unevenness may cause a thermal gradient which causes a local deformation of the article. For nanometer projection accuracy, this may cause a problem resulting in focus and/or overlay errors. That is, due to thermal deformation, the surface of the substrate and/or reticle bends away from an ideal projection plane, which may result in focus loss or at least an effective sideways movement of the image plane so that an overlay problem may occur.

SUMMARY

It is desirable, for example, to provide a photolithographic apparatus, wherein one or more of these thermal problems are treated and where an improved thermal stabilization of an article is provided.

According to an aspect of the invention, there is provided an article support constructed to support an article for lithographic processing purposes, the article support comprising a channel configuration arranged to guide thermally stabilizing media in the article support to provide thermal stabilization to the article, wherein the channel configuration comprises an input channel structure and an output channel structure, the input and output channel structures arranged in a nested configuration and connected to each other by a fine grid structure provided at or near a surface of the article support.

According to an aspect of the invention, there is provided a lithographic apparatus, comprising:
  an illumination system configured to condition a radiation beam;
  a projection system configured to project the radiation beam as patterned using a patterning device onto a target portion of a substrate; and
  an article support constructed to support the patterning device, the substrate, or both, the article support comprising a channel configuration arranged to guide thermally stabilizing media in the article support to provide thermal stabilization to the patterning device, the substrate, or both, wherein the channel configuration comprises an input channel structure and an output channel structure, the input and output channel structures arranged in a nested configuration and connected to each other by a fine grid structure provided at or near a surface of the article support.

According to an aspect of the invention, there is provided an immersion lithographic apparatus, comprising:
  an illumination system configured to condition a radiation beam;
  a projection system configured to project the radiation beam as patterned using a patterning device onto a target portion of a substrate;
  a liquid supply system configured to supply a liquid between the substrate and the projection system; and
  an article support constructed to support the patterning device, the substrate, or both, the article support comprising a channel configuration arranged to guide thermally stabilizing media in the article support to provide thermal stabilization to the patterning device, the substrate, or both, wherein the channel configuration comprises an input channel structure and an output channel structure, the input and output channel structures arranged in a nested configuration and connected to each other by a fine grid structure provided at or near a surface of the article support.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
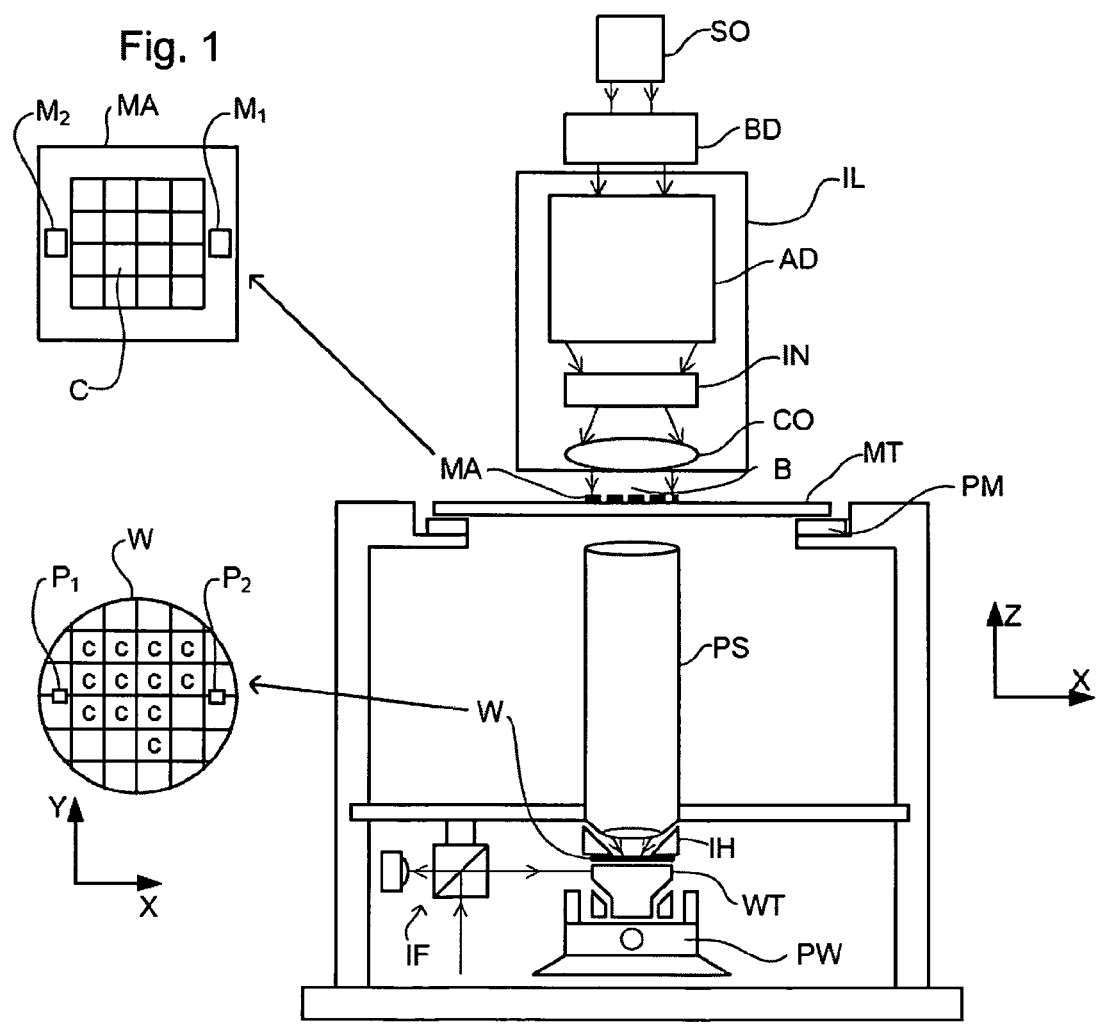
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask). The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, provided by a liquid supply system IH, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
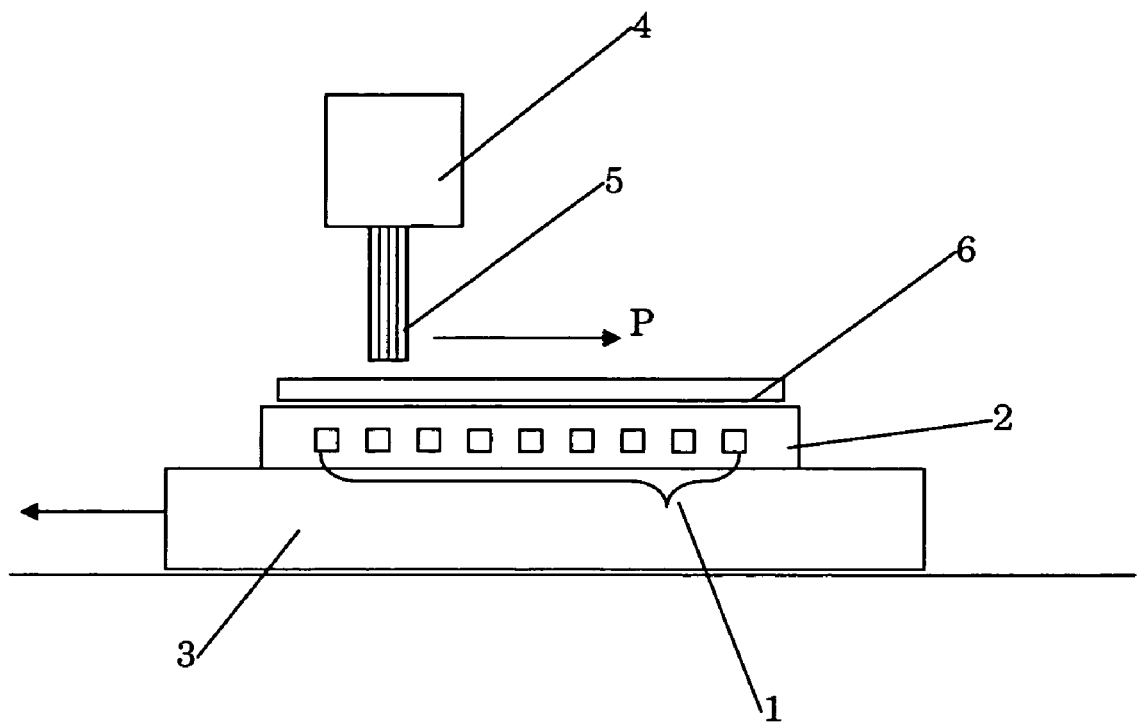
FIG. 2 depicts a first configuration of a channel arrangement to thermally stabilize an article.
Figure 3:
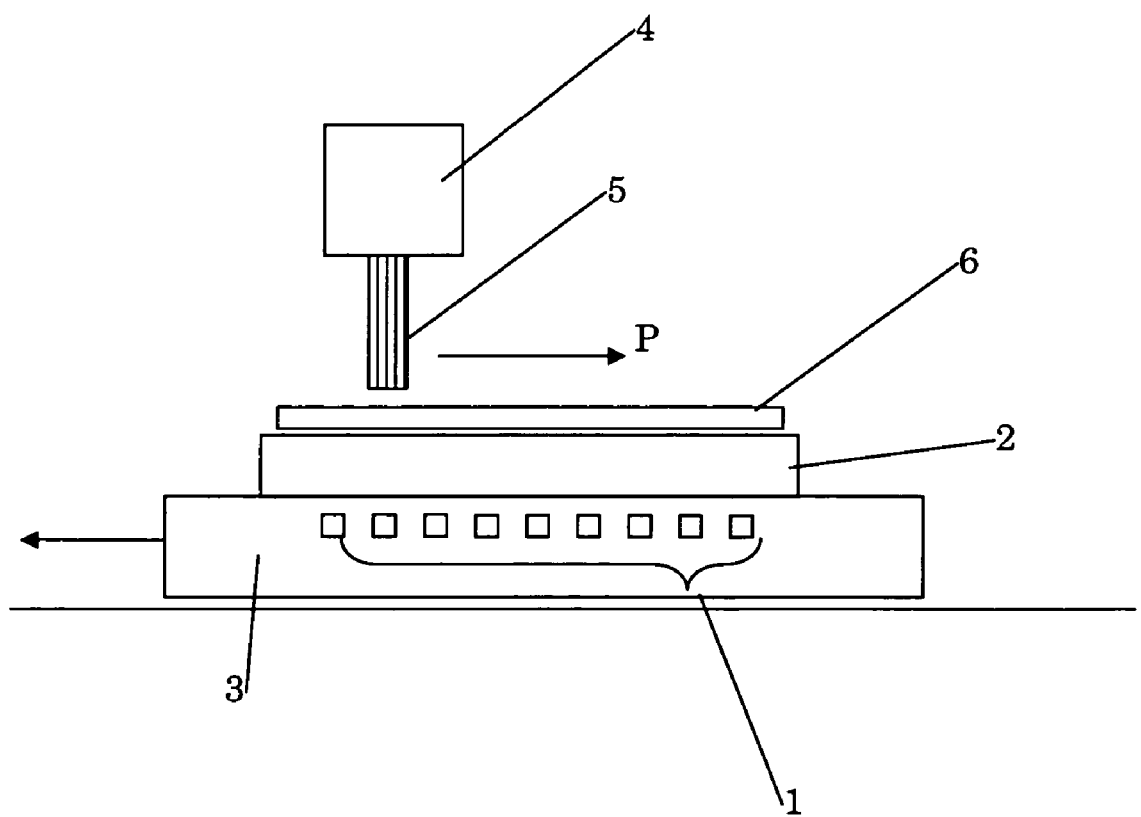
FIG. 3 provides an alternative configuration of a channel arrangement to thermally stabilize an article.

FIG. 2 and FIG. 3 depict embodiments of a channel structure 1 for a substrate support 2. As is apparent from the Figures, the substrate support 2 is moved by chuck 3 below a projection system 4 (described above with reference to PS in FIG. 1) that provides a patterned beam of radiation 5 to illuminate target positions on the substrate 6 (as discussed above). In this setup, the support structure 2, normally identified as a "wafer table", is a rigid structure, usually made of a glass type or ceramic material, that provides a flat plane of support to the substrate 6 and is in direct contact therewith. Usually, the support structure 2 comprises a plurality of protrusions (not shown) which limits the contact area to reduce the possibility of contamination causing a distortion of the ideal flat plane of the support structure 2 or of the substrate 6. In FIG. 2 the support structure 2 is provided with a channel structure 1 as will be further illustrated with reference to FIGS. 4 and 5. Alternatively, or possibly additionally, as depicted in FIG. 3, the channel structure 1 may be provided in a lower part of the substrate support 2, which is indirectly thermally coupled to the substrate 6 via the support structure 2 as depicted in FIG. 2. Such lower part is commonly referred to as a "chuck" 3 or second positioner PW, in particular, the fine stroke module thereof as explained with reference to FIG. 1.

Figure 4:
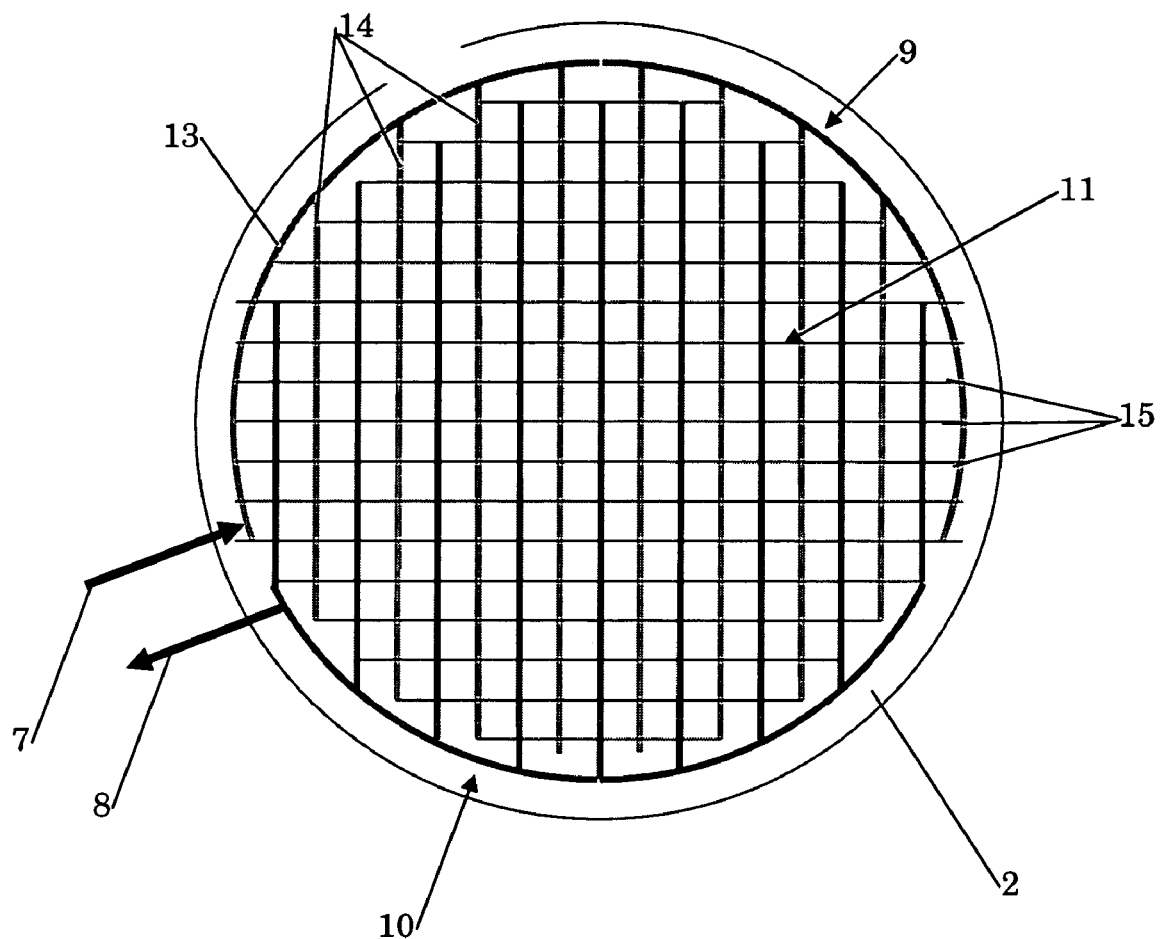
FIG. 4 illustrates a first channel configuration for a substrate table according to an embodiment of the invention.
Figure 5:
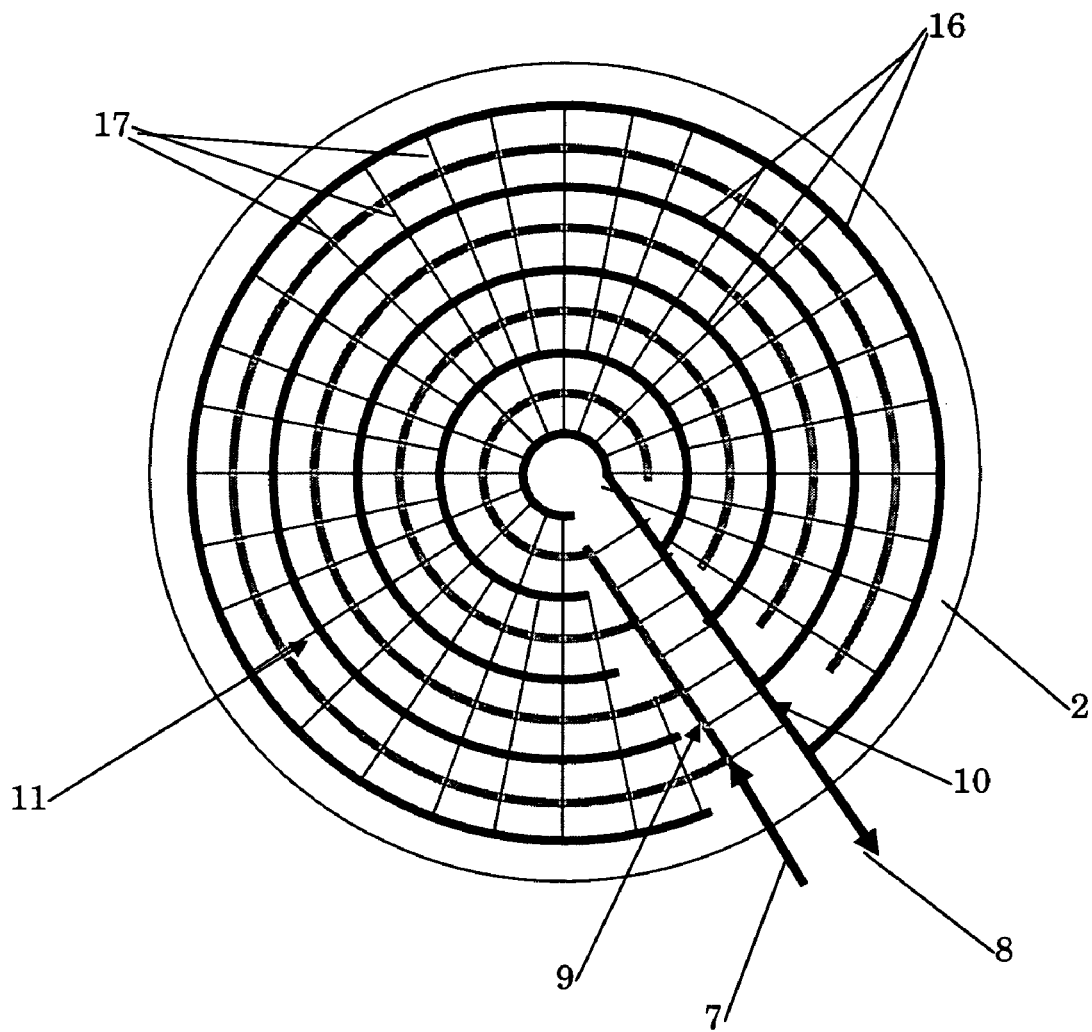
FIG. 5 illustrates a second channel configuration for a substrate table according to an embodiment of the invention.

According to FIGS. 4 and 5, embodiments are illustrated of a substrate support 2 comprising a media flow input 7 and a media flow output 8, the flow input 7 connected to an input channel structure 9 (the light shaded structure) and the output 8 connected to an output channel structure 10 (the dark shaded structure). The input and output channel structures 9 and 10 are provided in a nested configuration and connected to each other by a connecting fine grid structure 11 provided near a surface 12 of the substrate support 2 and connecting the input and the output channel structures 9 and 10 respectively. In an embodiment, the input and output channel structures are provided in a coarse grid configuration. In particular, FIG. 4 illustrates a substrate support 2 having a nested comb configuration. In such a configuration, input and output channels 9 and 10 are provided peripherally to the substrate support, each of the peripheral channels 13 branching out input and output channels 14 arranged as nested comb teeth, wherein the "teeth" 14 are arranged transversely to the peripheral channels 13. For reasons of intelligibility only, a limited number of channels 14 is indicated. The connecting fine grid structure 11 is formed by substantially parallel microchannels 15 oriented transversely to the comb teeth 14. The term microchannel refers to a channel structure with an interspacing of at most a few mm and with a channel width of less than 1 mm. In an embodiment, for a substrate support for a substrate of 300 mm cross section, more than 1000 microchannels may be present, in some embodiments even more than 10000.

In a simple calculation, the heat transfer H for heat flow in a cylindrical channel of diameter D is given by:

$$H=\lambda *Nu/D$$

where $\lambda$ is a heat transfer coefficient of the medium (which is, for water, 0.6 W/m/K) and Nu is a Nusselt number, which ranges between about 4 and about 20 depending on the type of flow (laminar flow—turbulent flow respectively). The medium may be a fluid, such as water or a gas.

Although turbulent flow may provide higher heat transfer rates, the downside thereof is a higher pressure drop, which limits the flow speed of the thermal stabilization medium. Accordingly, less effective heat transport may be the case unless a high pressure drop is permitted. Typically, a pressure drop induces a vibration which is unfavorable for stage dynamics. Hence, in an embodiment, a laminar flow is used, wherein the effective heat transfer may be enhanced by reducing the width (e.g., diameter) of the channel. To limit the pressure drop, the connecting channel distance (the interspacing between subsequent input and output channels) is therefore also limited. As an illustrative target flow rate, heat is transported within 0.2 sec out of a connecting channel into an output channel.

FIG. 5 shows an alternative nested channel structure 1. In this embodiment, a substrate support 2 is provided with a nested configuration of a radially oriented input channel 9 (the light shaded structure) and a radially oriented output channel 10 (the dark shaded structure). The radial input and output channels 9 and 10 each branch in alternatingly arranged concentric input and output channels 16. The connecting microchannel structure comprises radially oriented channels 17 oriented transversely to the concentric input and output channels 9 and 10 respectively.

The channel structure shown in FIG. 4 and in FIG. 5 may be configured according to the following illustrative dimensions for two embodiments:

Number of channels for a substrate support: 1200, alternatively 15000

Length of connecting channels: 75 mm, alternatively 6 mm

Figure 6:
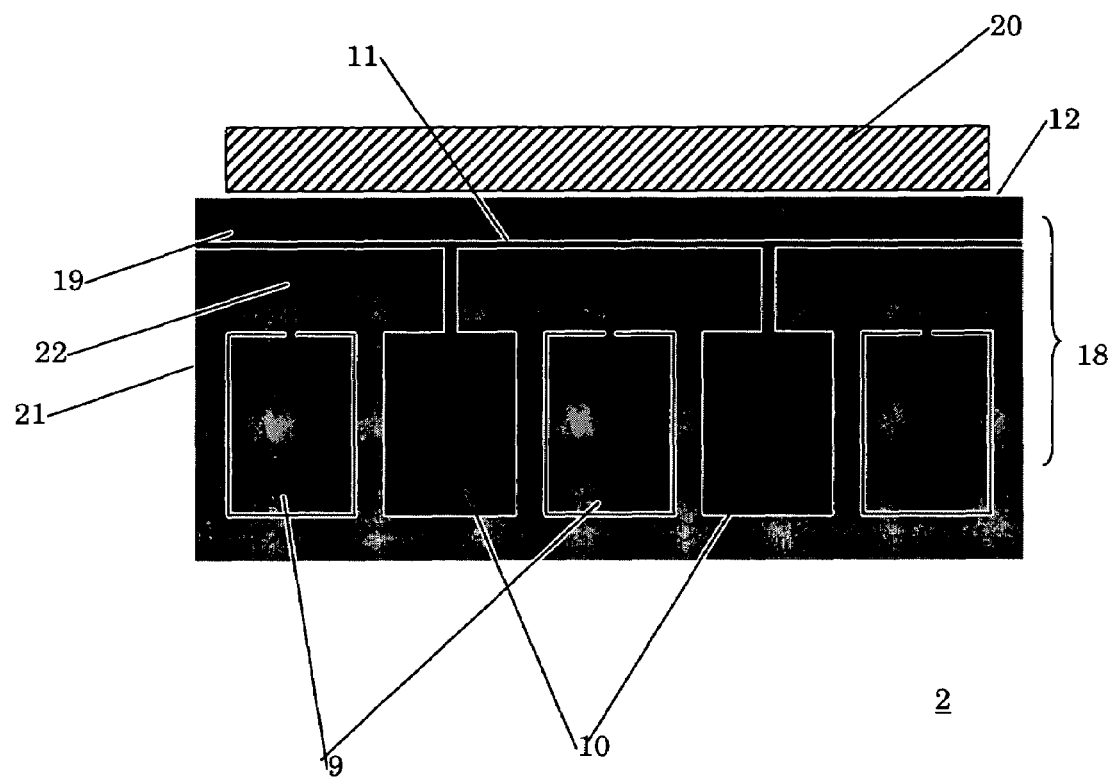
FIGS. 6 and 7 show illustrative schematic cross-sectional views of the channel structures, in particular, of FIGS. 4 and 5.
Figure 7:
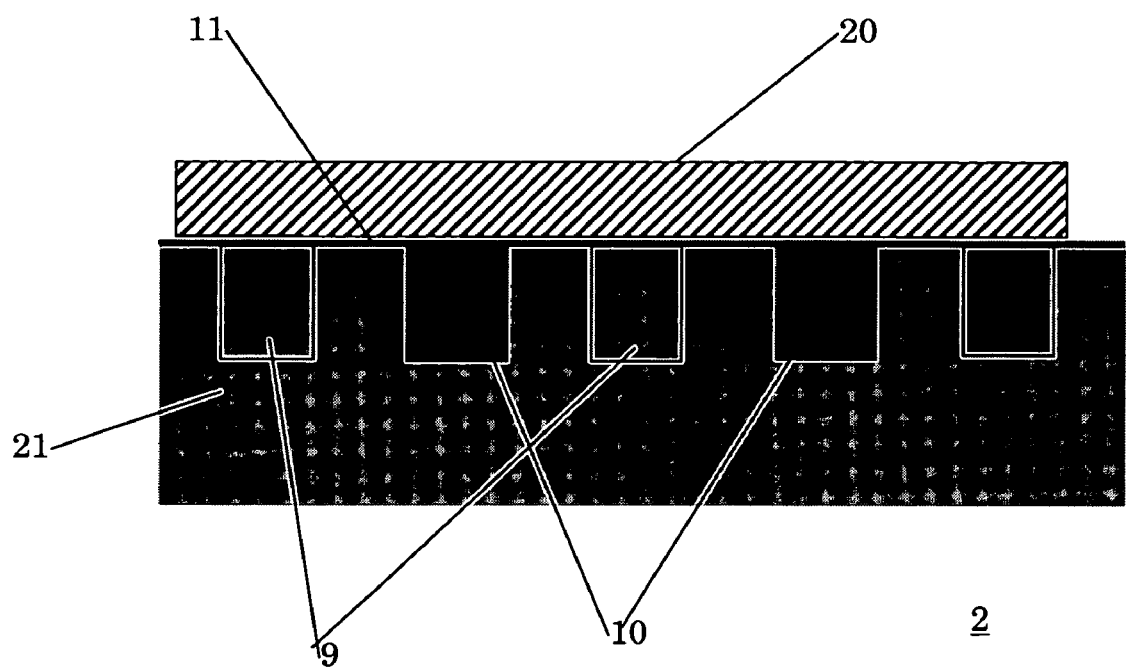

Cross-section dimensions of connecting channels: 0.3×0.3 mm, alternatively 0.2×0.05 mm Flow speed of media (water): 0.4 m/s Heat transfer: 8000 W/m$^2$K Pressure drop: 0.12 bar, alternatively 0.14 bar FIG. 6 and FIG. 7 show schematic cross-sectional views of the channel structures, in particular the structures illustrated in FIG. 4 and FIG. 5. Referring to the embodiment depicted in FIG. 6, the channel structure 1 may be integrated in a support structure 2 by providing a layered structure 18 that is bonded together. In one or both of the bonded layers 19 or 21 the channel layout may be provided to form a duct in the bonded configuration. In the cross section illustrated are input and output flow channels 9 and 10 provided in alternating fashion in a substrate support 2. The flow channels 9 and 10 are connected by a fine grid structure 11. Optionally, such as is shown in FIG. 6, a covering layer 19 is present, in an embodiment of a thermally conductive material such as SiSic or SiC. In FIG. 7 the covering layer is not present and the upper confinement of the thermally stabilizing media is provided by a lower side of a substrate 20 to be irradiated. Referring to FIG. 6, in an embodiment, the fine grid structure 11 is provided in the covering layer 19, so that optimal heat transfer may be provided to the thermal stabilizing medium flowing through the structure 11.

Although not shown in detail in the Figures, several embodiments of the fine grid structure 11 are feasible, in particular, the microchannel structure elaborated in FIG. 4 and FIG. 5. For example, a porous structure may be provided, for instance, a roughened surface with leaks provided from the input to the output channel structures 9 and 10 respectively. The fine grid structure 11 may be provided by an internal burl structure. Such a structure may be characterized by a plurality of spacing pins or burls, that space a lower and a higher wall of a substrate support. The higher wall may form a surface part 12 of the substrate support 2, whereas the lower wall may connect to the input and output channel structure 9 and 10 respectively.

As is shown in FIG. 6, in an embodiment, the input and output channel structures 9 and 10 are provided further away from the surface 12 than the fine grid structure 11. In addition, the channel dimensioning is so that heat transfer in the input and output channel structures 9 and 10 is relatively minimal in relation to the heat transfer of the connecting structure 11. This may be provided even more when the input and output channel structures 9 and 10 are provided in a thermally isolating layer 21 such as Zerodur, ULE, or Cordierite, which materials are known to the skilled in the art.

Although FIG. 6 shows a channel structure of input and output channels that are buried deep in the material, connected through an additional (vertical) microchannel structure 22, this additional structure may be dispensed with, as is shown in FIG. 7. Although the illustrated embodiments refer to a substrate support to be used to support a substrate to be targeted with a patterned beam, the structure may be very well applied for a reticle support or any other support that needs thermal stabilization.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An article support constructed to support an article for lithographic processing purposes, the article support comprising a channel configuration arranged to guide thermally stabilizing media in the article support to provide thermal stabilization to the article, wherein the channel configuration comprises an input channel structure and an output channel structure, the input and output channel structures each having a plurality of flow channels extending in a plane substantially parallel to a surface of the article support to support the article, wherein a flow channel of the input channel structure is nested between flow channels of the output channel structure and a flow channel of the output channel structure is nested between flow channels of the input channel structure, wherein the input and output channel structures are connected to each other by a fine grid structure provided at or near the surface, and wherein the input and output channel structures are provided further away from the article than the fine grid structure.

2. The article support of claim 1, wherein the fine grid structure comprises (i) a dense microchannel structure, (ii) a pin structure comprising a plurality of spacing pins spacing a lower and a higher wall, (iii) a porous structure, or (iv) any combination of (i)-(iii).

3. The article support of claim 1, wherein the input and output channel structures are provided in a coarse grid configuration.

4. The article support of claim 1, wherein the input and output channel structures are provided in a thermally isolating material and the fine grid structure is provided in a thermally conductive material.

5. The article support of claim 4, wherein the thermally isolating material comprises Zerodur, ULE, Cordierite, or any combination thereof and the thermally conductive material comprises SiSiC, SIC or both.

6. The article support of claim 1, wherein a channel width of the input channel structure, the output channel structure, or both is larger than a channel width of the fine grid structure.

7. The article support of claim 1, wherein the nested configuration comprises a nested comb configuration of a peripheral input flow channel and a peripheral output flow channel, the peripheral input and output flow channels branching input and output flow channels arranged as nested comb teeth.

8. The article support of claim 7, wherein the fine grid structure comprises substantially parallel channels oriented transversely to the comb teeth.

9. The article support of claim 1, wherein the nested configuration comprises a radially oriented input flow channel and a radially oriented output flow channel, the radial input and output flow channels branching alternatingly arranged concentric input and output flow channels.

10. The article support of claim 9, wherein the fine grid structure comprises radial channels oriented transversely to the concentric input and output flow channels.

11. The article support of claim 1, wherein the input and output channel structures comprise channels of more than 1 mm cross sectional width, wherein the fine grid structure comprises channels of not more than 1 mm cross sectional width, or both.

12. A lithographic apparatus, comprising:
a projection system configured to project a radiation beam as patterned using a patterning device onto a target portion of a substrate; and
an article support constructed to support the patterning device, the substrate, or both, the article support comprising a channel configuration arranged to guide thermally stabilizing media in the article support to provide thermal stabilization to the patterning device, the substrate, or both, wherein the channel configuration comprises an input channel structure and an output channel structure, the input and output channel structures each having a plurality of flow channels extending in a plane substantially parallel to a surface of the article support to support the article, wherein a flow channel of the input channel structure is nested between flow channels of the output channel structure and a flow channel of the output channel structure is nested between flow channels of the input channel structure, wherein the input and output channel structures are connected to each other by a fine grid structure provided at or near the surface, and wherein a channel width of the input channel structure, the output channel structure, or both is larger than a channel width of the fine grid structure.

13. The apparatus of claim 12, wherein the nested configuration comprises a nested comb configuration of a peripheral input flow channel and a peripheral output flow channel, the peripheral input and output flow channels branching input and output flow channels arranged as nested comb teeth.

14. The apparatus of claim 12, wherein the nested configuration comprises a radially oriented input flow channel and a radially oriented output flow channel, the radial input and output flow channels branching alternatingly arranged concentric input and output flow channels.

15. The apparatus of claim 12, wherein the input and output channel structures are provided further away from the patterning device, the substrate, or both, than the fine grid structure.

16. The apparatus of claim 12, wherein the input and output channel structures comprise channels of more than 1 mm cross sectional width, wherein the fine grid structure comprises channels of not more than 1 mm cross sectional width, or both.

17. An immersion lithographic apparatus, comprising:
a projection system configured to project a radiation beam as patterned using a patterning device onto a target portion of a substrate;
a liquid supply system configured to supply a liquid between the substrate and the projection system; and
an article support constructed to support the patterning device, the substrate, or both, the article support comprising a channel configuration arranged to guide thermally stabilizing media in the article support to provide thermal stabilization to the patterning device, the substrate, or both, wherein the channel configuration comprises an input channel structure and an output channel structure, the input and output channel structures extending in a plane substantially parallel to a surface of the article support to support the article and each having a plurality of flow channels, wherein a flow channel of the input channel structure is nested between flow channels of the output channel structure and a flow channel of the output channel structure is nested between flow channels of the input channel structure, and wherein the input and output channel structures are connected to each other by a fine grid structure provided at or near the surface.

18. The apparatus of claim 17, wherein the nested configuration comprises a nested comb configuration of a peripheral input flow channel and a peripheral output flow channel, the peripheral input and output flow channels branching input and output flow channels arranged as nested comb teeth.

19. The apparatus of claim 17, wherein the nested configuration comprises a radially oriented input flow channel and a radially oriented output flow channel, the radial input and output flow channels branching alternatingly arranged concentric input and output flow channels.

* * * * *